(12) United States Patent
Kondou et al.

(10) Patent No.: US 9,270,157 B2
(45) Date of Patent: Feb. 23, 2016

(54) DC-DC CONVERTER AND SEMICONDUCTOR INTEGRATED CIRCUIT

(71) Applicant: FUJITSU LIMITED, Kawasaki-shi, Kanagawa (JP)

(72) Inventors: Masafumi Kondou, Kawasaki (JP); Toshihiko Mori, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 277 days.

(21) Appl. No.: 13/913,023

(22) Filed: Jun. 7, 2013

(65) Prior Publication Data

US 2014/0028271 A1    Jan. 30, 2014

(30) Foreign Application Priority Data

Jul. 25, 2012  (JP) .................................. 2012-164550

(51) Int. Cl.
| | |
|---|---|
| *H02M 1/08* | (2006.01) |
| *H02M 3/158* | (2006.01) |
| *H02M 3/156* | (2006.01) |
| *H02M 1/00* | (2007.01) |

(52) U.S. Cl.
CPC ............... *H02M 1/08* (2013.01); *H02M 3/156* (2013.01); *H02M 3/1588* (2013.01); *H02M 3/158* (2013.01); *H02M 2001/0006* (2013.01); *H03K 2217/0063* (2013.01); *H03K 2217/0072* (2013.01)

(58) Field of Classification Search
CPC ............. H02M 2001/0006; H02M 2001/0032; H02M 1/08; H02M 3/155; H02M 3/156; H02M 3/158; H02M 3/1588
See application file for complete search history.

(56) References Cited

U.S. PATENT DOCUMENTS

| 5,627,460 | A * | 5/1997 | Bazinet et al. ................ 323/288 |
| 7,808,286 | B1 * | 10/2010 | Miller ..................... H02M 1/08 |
| | | | 327/108 |
| 2009/0243569 | A1 * | 10/2009 | Nguyen ........................ 323/274 |
| 2010/0327692 | A1 | 12/2010 | Yoshikawa et al. |
| 2011/0298438 | A1 * | 12/2011 | Shi .......................... H02M 1/08 |
| | | | 323/282 |
| 2012/0025791 | A1 * | 2/2012 | Abu Qahouq et al. ........ 323/271 |
| 2012/0086479 | A1 * | 4/2012 | Carpenter et al. ............. 327/109 |
| 2012/0218006 | A1 * | 8/2012 | Lee ........................ G11C 5/147 |
| | | | 327/108 |

(Continued)

FOREIGN PATENT DOCUMENTS

| JP | 2006-254577 A | 9/2006 |
| JP | 2011-10452 A | 1/2011 |

OTHER PUBLICATIONS

Vincent Pinon et al., "A Single-Chip WCDMA Envelope Reconstruction LDMOS PA with 130MHz Switched-Mode Power Supply", ISSCC/Session 31/RF & mm-Wave Power Amplifiers/ 31.4, Dig. Tech. Papers, pp. 564-565, 636, Feb. 2008.

*Primary Examiner* — Fred E Finch, III
(74) *Attorney, Agent, or Firm* — Arent Fox LLP

(57) ABSTRACT

A DC-DC converter includes: a high-side switch; a low-side switch coupled to the high-side switch in series; a capacitor configured to be charged while the low-side switch is turned on and to increase a driving voltage for turning on the high-side switch by a charged voltage; a buffer configured to output a control signal for controlling the high-side switch; a latch configured to receive the control signal at a first input terminal, retain the control signal, and output the control signal to the high-side switch; and a switch configured to receive the control signal from the latch and deactivate the buffer.

20 Claims, 10 Drawing Sheets

(56) References Cited

U.S. PATENT DOCUMENTS

| | | | |
|---|---|---|---|
| 2012/0223687 A1* | 9/2012 | Liu et al. | 323/271 |
| 2013/0151825 A1* | 6/2013 | Huynh | 713/1 |
| 2013/0271101 A1* | 10/2013 | Nanov | 323/282 |
| 2014/0021933 A1* | 1/2014 | Gladish | H02M 1/08 323/311 |
| 2014/0084835 A1* | 3/2014 | Kadowaki et al. | 318/479 |

* cited by examiner

DC-DC CONVERTER AND SEMICONDUCTOR INTEGRATED CIRCUIT

CROSS-REFERENCE TO RELATED APPLICATION

This application is based upon and claims the benefit of priority of the prior Japanese Patent Application No. 2012-164550, filed on Jul. 25, 2012, the entire contents of which are incorporated herein by reference.

FIELD

The embodiments discussed herein are related to a direct current to direct current (DC-DC) converter.

BACKGROUND

DC-DC converters reduce or increase an input predetermined DC voltage to transform the input DC voltage into a DC voltage to be used in an electronic device.

Related arts are disclosed in Japanese Laid-open Patent Publication Nos. 2011-10452 and 2006-254577 and V. Pinon, et. al., "A Single-Chip WCDMA Envelope Reconstruction LDMOS PA with 130 MHz Switched-Mode Power Supply," ISSCC International Solid-State Circuits Conference/Session 31/RF & mm-Wave Power Amplifiers/31.4, Dig. Tech. Papers, pp. 564-565, February 2008, the entirety of which is incorporated by reference herein.

SUMMARY

According to one aspect of the embodiments, a DC-DC converter includes: a high-side switch; a low-side switch coupled to the high-side switch in series; a capacitor configured to be charged while the low-side switch is turned on and to increase a driving voltage for turning on the high-side switch by a charged voltage; a buffer configured to output a control signal for controlling the high-side switch; a latch configured to receive the control signal at a first input terminal, retain the control signal, and output the control signal to the high-side switch; and a switch configured to receive the control signal from the latch and deactivate the buffer.

The object and advantages of the invention will be realized and attained by means of the elements and combinations particularly pointed out in the claims.

It is to be understood that both the foregoing general description and the following detailed description are examples and are explanatory in nature and are not restrictive of the invention, as claimed.

DESCRIPTION OF EMBODIMENTS

In a step-down DC-DC converter, a high-side switch and a low-side switch coupled in series are arranged between a DC voltage source and ground. A capacitor that smoothes an output of an inductor is coupled between the ground and the output of the inductor coupled to a connection point between the high-side switch and the low-side switch. The high-side switch and the low-side switch are alternately driven, so that the inductor repeats storage and release of magnetic energy. A voltage output from the inductor is smoothed by the capacitor, thereby obtaining a reduced DC voltage.

Figure 1:
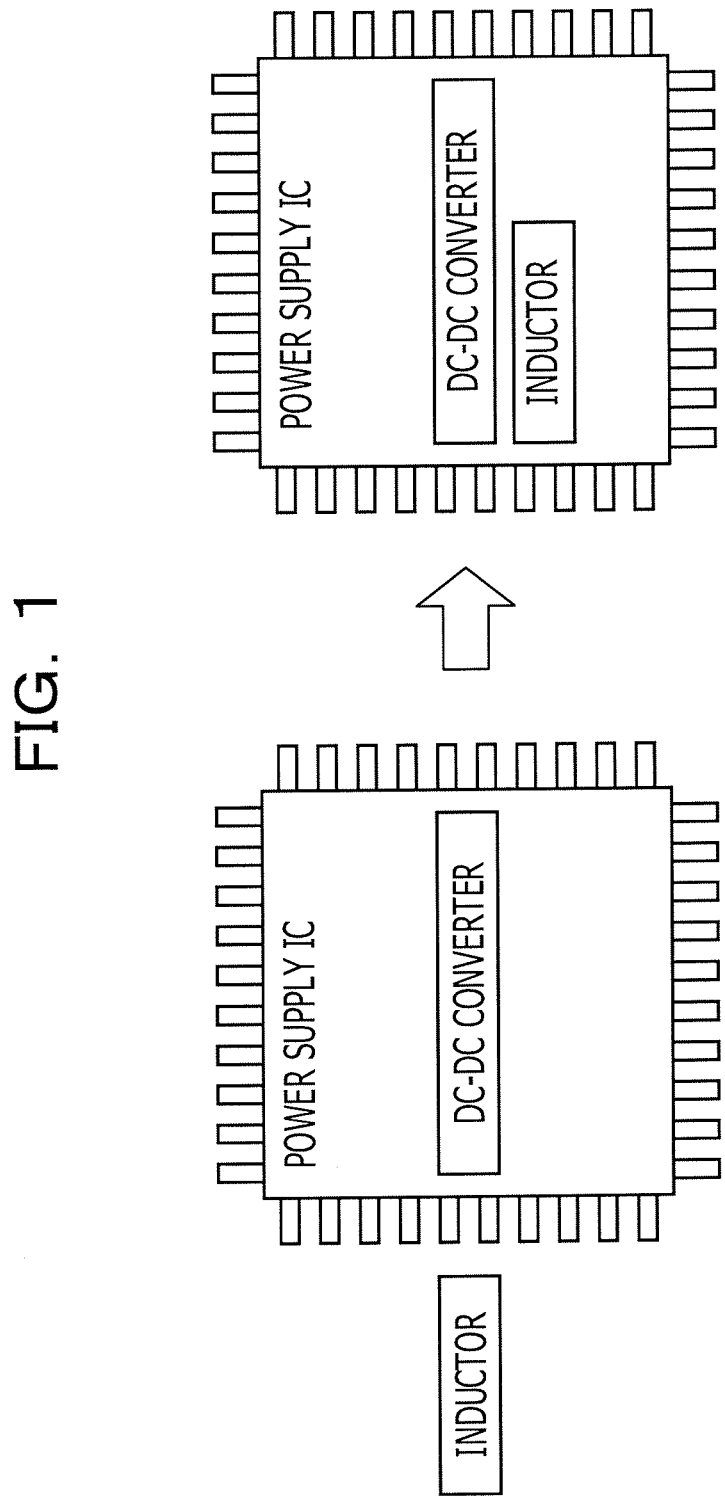
FIG. 1 illustrates an example power supply integrated circuit (IC)

FIG. 1 illustrates an example power supply IC. An inductor disposed outside the power supply IC may be miniaturized. The inductor may be disposed together with a DC-DC converter in the power supply IC. A capacitor may also be disposed together with the DC-DC converter in the power supply IC.

If the inductor and the capacitor are reduced in size, an output voltage of the DC-DC converter may have ripple characteristics. To maintain the ripple characteristics of the output voltage of the DC-DC converter, a switching frequency may increase.

The increase of the switching frequency causes an increase in power loss based on charge and discharge of parasitic capacitance. To reduce the power loss, a transistor having N-type polarity and a small parasitic capacitance may be used as a high-side switch.

If the high-side switch includes such a transistor having N-type polarity, a boost circuit that increases a driving voltage for turning on the high-side switch may be used.

A circuit may be used to maintain a voltage to be applied to a circuit element, such as a transistor, within a range of withstand voltages of the circuit elements when the driving voltage for turning on the high-side switch is increased by the boost circuit.

In a DC-DC converter including a transistor having N-type polarity as a high-side switch, because the DC-DC converter includes the boost circuit and the above-described circuit, its power consumption may increase or its operating speed may decrease.

Figure 2:
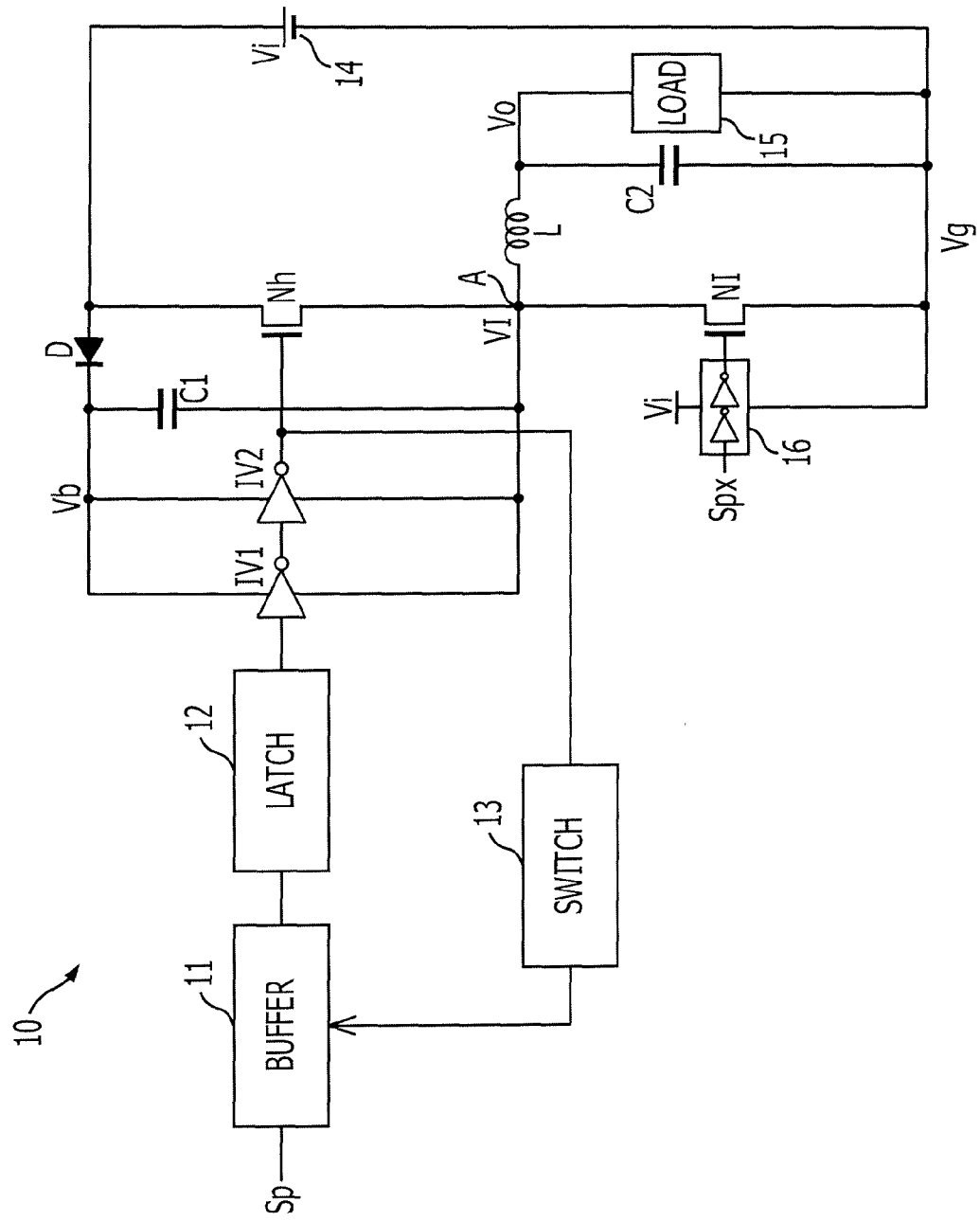
FIG. 2 illustrates an example DC-DC converter.

FIG. 2 illustrates an example DC-DC converter.

Referring to FIG. 2, a DC-DC converter 10 reduces a voltage Vi supplied from a DC voltage source 14 and supplies an output voltage Vo to a load.

In the DC-DC converter 10, a high-side switch Nh and a low-side switch Nl each having N-type polarity are coupled in series between a positive electrode and a negative electrode of the DC voltage source 14. A drain of the high-side switch Nh is coupled to the positive electrode of the DC voltage source 14. A source of the high-side switch Nh is coupled via a connection point A to a drain of the low-side switch Nl. A source of the low-side switch Nl is coupled to the negative electrode of the DC voltage source 14.

A voltage at the connection point A may be referred to as a "voltage Vl." A voltage on the negative electrode side of the DC voltage source 14 may be referred to as a "voltage Vg."

A NMOS transistor may be used as each of the high-side switch Nh and the low-side switch Nl of N-type polarity. A source of each NMOS transistor may be electrically coupled to a substrate.

An inductor L may be coupled to the connection point A between the high-side switch Nh and the low-side switch NI. A capacitor C2 that smoothes an output of the inductor L may be disposed between the output of the inductor L and the negative electrode of the DC voltage source 14.

The output voltage Vo is supplied from a connection point between the inductor L and the negative electrode of the DC voltage source 14 to a load 15.

A capacitor C1 is coupled between the drain and the source of the high-side switch Nh. The capacitor C1 is charged while the low-side switch NI is turned on and increases a driving voltage for turning on the high-side switch Nh by a charged voltage.

A diode D configured to avoid application of the voltage charged in the capacitor C1 to the DC voltage source 14 may be disposed between the drain of the high-side switch Nh and the capacitor C1.

A voltage at a high-potential terminal of the capacitor C1 coupled to the diode D may be referred to as a "voltage Vb."

A control signal Sp for controlling the high-side switch Nh may be supplied from a higher-level circuit to a buffer 11. The buffer 11 outputs the control signal Sp to a latch 12.

The latch 12 retains the control signal Sp supplied from the buffer 11 and outputs the control signal Sp to an inverter IV1.

Upon receiving a high-level signal, the inverter IV1 outputs a signal at a level of the voltage VI, which is the voltage at the connection point A, to an inverter IV2. Upon receiving a low-level signal, the inverter IV1 outputs a signal at a level of the voltage Vb to the inverter IV2.

Upon receiving a high-level signal, the inverter IV2 outputs a signal at the voltage level VI, which is the voltage at the connection point A, to a gate of the high-side switch Nh. Upon receiving a low-level signal, the inverter IV2 outputs a signal at the voltage level Vb to the gate of the high-side switch Nh.

Accordingly, when the control signal Sp is a signal for turning on the high-side switch Nh, the signal at the voltage level Vb is output to the gate of the high-side switch Nh. When the control signal Sp is a signal for turning off the high-side switch Nh, the signal at the voltage level VI which is the voltage at the connection point A is output to the gate of the high-side switch Nh.

The output signal of the inverter IV2 is supplied to a switch 13. Upon receiving a high-level signal, the switch 13 deactivates the buffer 11. When the control signal Sp is a signal for turning on the high-side switch Nh, therefore, the switch 13 deactivates the buffer 11.

After deactivation of the buffer 11, the latch 12 retains the control signal Sp, supplied from the buffer 11, for turning on the high-side switch Nh and continues to output the signal to the high-side switch Nh via the inverters IV1 and IV2.

In the DC-DC converter 10, an inverted signal Spx of the control signal Sp is supplied as a signal for controlling the low-side switch NI from the higher-level circuit through an input buffer 16 to a gate of the low-side switch NI.

Upon receiving a high-level signal, the input buffer 16 outputs a signal at a level of the voltage Vi of the DC voltage source 14 to the gate of the low-side switch NI. Upon receiving a low-level signal, the input buffer 16 outputs a signal at a level of the voltage Vg to the gate of the low-side switch NI.

Accordingly, when the control signal Sp is a signal for turning off the high-side switch Nh, for example, when the inverted signal Spx is a high-level signal, a signal at the voltage level Vi is output to the gate of the low-side switch NI. When the control signal Sp is a signal for turning on the high-side switch Nh, for example, when the inverted signal Spx is a low-level signal, a signal at the voltage level Vg is output to the gate of the low-side switch NI.

In the DC-DC converter 10, while the low-side switch NI is turned on, the capacitor C1 is charged by the DC voltage source 14. When the control signal Sp is a signal for turning on the high-side switch Nh, a signal at the voltage level Vb, which is the sum of charged voltages of the capacitors C1 and C2 coupled in series, is output to the gate of the high-side switch Nh, thus turning on the high-side switch Nh. While the high-side switch Nh is turned on, the capacitor C2 is charged by the DC voltage source 14.

When the control signal Sp is a signal for turning on the high-side switch Nh, a signal at the voltage level Vb is supplied to the gate of the high-side switch Nh and the voltage VI is applied to the source of the high-side switch Nh, so that a voltage difference between the gate and the source is (Vb–VI). The voltage difference (Vb–VI) may be, for example, the voltage Vi of the DC voltage source 14. Accordingly, a voltage exceeding a withstand voltage may not be applied to the high-side switch Nh.

In the DC-DC converter 10, the high-side switch Nh and the low-side switch NI are alternately driven, thereby repeating storage and release of magnetic energy in the inductor L. A voltage output from the inductor L is smoothed by the capacitor C2, thus obtaining a reduced DC output voltage Vo.

The DC-DC converter 10 may include a feedback circuit that measures the output voltage Vo and feeds back a measurement to the higher-level circuit. The higher-level circuit may include a circuit that generates a control signal for protecting the high-side switch Nh and the low-side switch NI from being turned on substantially at the same time.

Because the DC-DC converter 10 includes the high-side switch Nh and the low-side switch NI of N-type polarity, high-speed operation may be performed. The high-side switch Nh and the low-side switch NI are smaller in size than a switch having a P-type polarity. This may result in a reduction in parasitic capacitance and power consumption.

The buffer 11, which receives the control signal Sp, and the latch 12, which retains the control signal Sp output from the buffer 11 and outputs the control signal Sp, are arranged as individual circuit elements. Accordingly, the buffer 11 may have a higher driving capability to achieve higher throughput. The latch 12 may be configured in size for low power consumption.

Because the switch 13 deactivates the buffer 11, the power consumption may be reduced.

Figure 3:
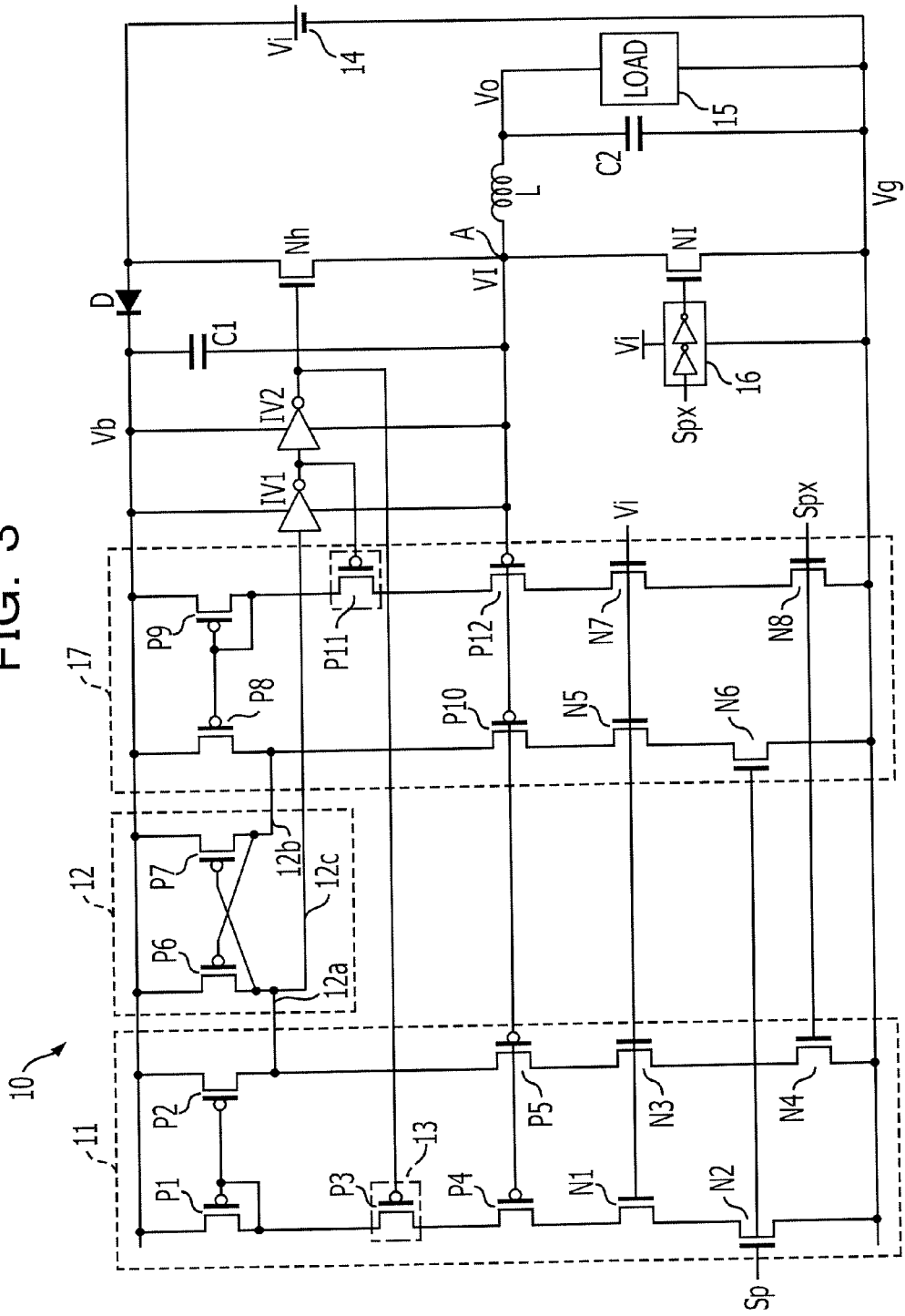
FIG. 3 illustrates an example DC-DC converter.

FIG. 3 illustrates an example of a DC-DC converter. In FIG. 3, substantially the same components as or components similar to those in FIG. 2 are designated by the same reference numerals or symbols and a description of the previously described components may be omitted.

As illustrated in FIG. 3, the DC-DC converter 10 includes the buffer 11 that outputs the control signal Sp for controlling the high-side switch Nh and the latch 12 that receives the control signal Sp from the buffer 11 at a first input terminal 12a and retains the control signal Sp. The latch 12 outputs the retained control signal Sp at an output terminal 12c to the high-side switch Nh via the inverter IV1 and the inverter IV2.

The DC-DC converter 10 may include an auxiliary buffer 17 that receives the inverted signal Spx of the control signal Sp for controlling the high-side switch Nh and outputs the inverted signal Spx to a second input terminal 12b of the latch 12.

Because the inverted signal Spx is supplied to the second input terminal 12b, the latch 12 retains the control signal Sp, supplied from the buffer 11, for turning on the high-side switch Nh after deactivation of the buffer 11 and continues to output the signal to the high-side switch Nh.

The buffer 11 may include a transistor P1 and a transistor P2 that are coupled as a differential pair and have a P-type polarity. A PMOS transistor may be used as a transistor having a P-type polarity.

A source of the transistor P1 is coupled to the high-potential terminal of the capacitor C1 and is supplied with the voltage Vb. The transistor P1 has a drain and a gate short-circuited to each other. The gate of the transistor P1 is coupled to a gate of the transistor P2. A source of the transistor P2 is also coupled to the high-potential terminal of the capacitor C1 and is also supplied with the voltage Vb.

The source of each PMOS transistor may be electrically coupled to a substrate.

A transistor P3 and a transistor P4, each serving as PMOS transistors, and a transistor N1 and a transistor N2, each serving as a NMOS transistor, are coupled in series between the drain of the transistor P1 and the negative electrode of the DC voltage source 14.

A transistor P5, serving as a PMOS transistor, and a transistor N3 and a transistor N4, each serving as a NMOS transistor, are coupled in series between the drain of the transistor P2 and the negative electrode of the DC voltage source 14.

The voltage Vi of the DC voltage source 14 is supplied to each of the gates of the transistors N1 and N3.

The control signal Sp for controlling the high-side switch Nh is supplied from the higher-level circuit to a gate of the transistor N2. The inverted signal Spx of the control signal Sp for controlling the high-side switch Nh is supplied from the higher-level circuit to a gate of the transistor N4. The input control signal Sp is output from the drain of the transistor P2 to the first input terminal 12a of the latch 12.

A signal output from the inverter IV2 is supplied to a gate of the transistor P3. Upon receiving a high-level signal at the gate, the transistor P3 is turned off. The transistor P3 may correspond to the switch 13 illustrated in FIGS. 2 and 3.

After the control signal Sp is supplied as a signal for turning on the high-side switch Nh to the buffer 11 and is output from the buffer 11 to the latch 12, when the inverter IV2 outputs a high-level signal, the transistor P3 is turned off. Consequently, the buffer 11 is deactivated.

In the buffer 11, the transistors P2, P5, N3, and N4 may be circuit elements for outputting the control signal Sp to the latch 12. Raising the driving capabilities of the transistors P2, P5, N3, and N4 enables an output signal for the latch 12 to rise and fall at high speed.

In the buffer 11, the transistors P1, P3, P4, N1, and N2 may be circuit elements for supplying a driving voltage to the gate of the transistor P2. The transistors P1, P3, P4, N1, and N2 may have a size large enough to drive the gate of the transistor P2. Accordingly, the transistors P1, P3, P4, N1, and N2 may have a size with lower power consumption than the transistor P2, P5, N3, or N4.

The latch 12 may include two transistors P6 and P7, each serving as a PMOS transistor.

A source of the transistor P6 is coupled to the high-potential terminal of the capacitor C1 and is supplied with the voltage Vb. A drain of the transistor P6 is coupled to the first input terminal 12a. The drain of the transistor P6 is coupled to a gate of the transistor P7. The drain of the transistor P6 is further coupled to the output terminal 12c of the latch 12.

A source of the transistor P7 is coupled to the high-potential terminal of the capacitor C1 and is supplied with the voltage Vb. A drain of the transistor P7 is coupled to a gate of the transistor P6. The drain of the transistor P7 is coupled to the second input terminal 12b.

In the latch 12, the transistors P6 and P7 may have a size large enough to retain and output the input control signal Sp. The transistors P6 and P7 may have a size with low power consumption.

The auxiliary buffer 17 outputs the inverted signal Spx of the control signal Sp to the latch 12 to assist an operation of the latch 12. The auxiliary buffer 17 may have a circuit topology that is substantially the same as or similar to that of the buffer 11 which outputs the control signal Sp to the latch 12.

The auxiliary buffer 17 may include two transistors P8 and P9 which are coupled as a differential pair and each serve as a PMOS transistor.

A source of the transistor P9 is coupled to the high-potential terminal of the capacitor C1 and is supplied with the voltage Vb. The transistor P9 has a drain and a gate short-circuited to each other. The gate of the transistor P9 is coupled to a gate of the transistor P8. A source of the transistor P8 is also coupled to the high-potential terminal of the capacitor C1 and is also supplied with the voltage Vb.

A transistor P11 and a transistor P12, each serving as a PMOS transistor, and a transistor N7 and a transistor N8, each serving as a NMOS transistor, are coupled in series between the drain of the transistor P9 and the negative electrode of the DC voltage source 14.

A transistor P10, serving as a PMOS transistor, and a transistor N5 and a transistor N6, each serving as a NMOS transistor, are coupled in series between a drain of the transistor P8 and the negative electrode of the DC voltage source 14.

The voltage Vi of the DC voltage source 14 is supplied to each of gates of the transistors N5 and N7.

The inverted signal Spx of the control signal Sp for controlling the high-side switch Nh is supplied from the higher-level circuit to a gate of the transistor N8. The control signal Sp for controlling the high-side switch Nh is supplied from the higher-level circuit to a gate of the transistor N6. The input inverted signal Spx is output from the drain of the transistor P8 to the second input terminal 12b of the latch 12.

A signal output from the inverter IV1 is supplied to a gate of the transistor P11. Upon receiving a high-level signal at the gate, the transistor P11 is turned off.

After the control signal Sp is supplied as a signal for turning off the high-side switch Nh to the auxiliary buffer 17 and is output from the auxiliary buffer 17 to the latch 12, when the inverter IV1 outputs a high-level signal, the transistor P11 is turned off. Consequently, the auxiliary buffer 17 is deactivated.

The transistors included in the auxiliary buffer 17 may have a size large enough to output the inverted signal Spx of the input control signal Sp to the latch 12. The transistors may have a size with low power consumption.

FIGS. 4 to 10 each illustrate an example of an operation of a DC-DC converter.

For example, a threshold voltage of each PMOS transistor may be −1 V, that of each NMOS transistor may be 1 V, and the voltage Vi may be 5 V. The control signal Sp and the inverted signal Spx may have a voltage level within a range of 0 to 5 V. Voltages at main circuit parts may be indicated by numerical values.

Figure 4:
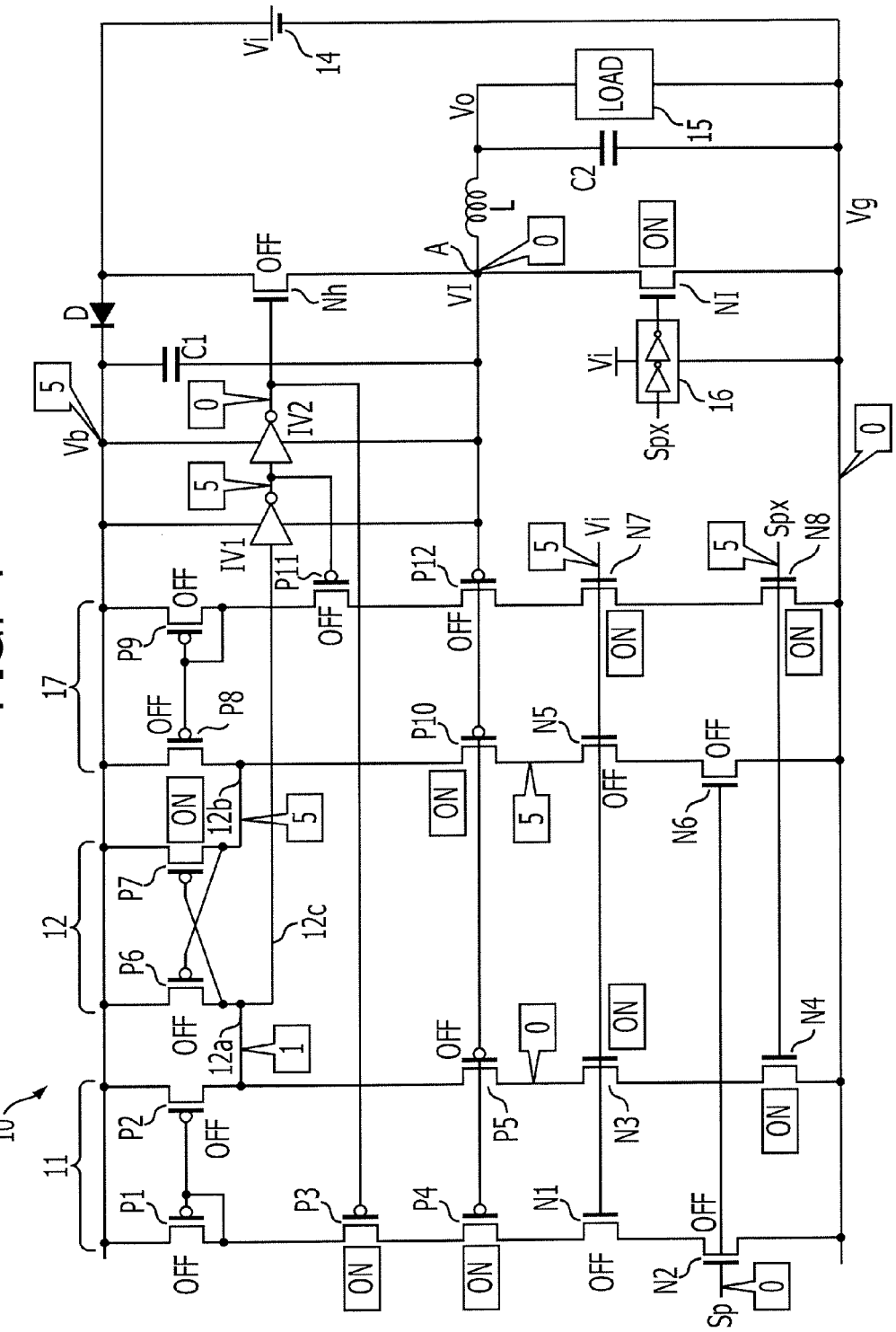
FIG. 4 illustrates an example of an operation of an example DC-DC converter.

Referring to FIG. 4, the control signal Sp for turning off the high-side switch Nh is supplied to the gate of the transistor N2 of the buffer 11. The inverted signal Spx of the control signal Sp for turning off the high-side switch Nh is supplied to the gate of the transistor N4. The transistors P1 and P2 are off. A low-level signal corresponding to the control signal Sp is output from the drain of the transistor P2 to the first input terminal 12a of the latch 12.

The inverted signal Spx of the control signal Sp for turning off the high-side switch Nh is supplied to the gate of the transistor N8 of the auxiliary buffer 17. The control signal Sp for turning off the high-side switch Nh is supplied to the gate of the transistor N6. The transistors P8 and P9 are off. A high-level signal corresponding to the inverted signal Spx is output from the drain of the transistor P8 to the second input terminal 12b of the latch 12.

The latch 12 retains the low-level signal supplied from the buffer 11 and outputs the low-level signal at the output terminal 12c to the inverter IV1.

Upon receiving the low-level signal, the inverter IV1 outputs a signal at the voltage level Vb to the inverter IV2.

Upon receiving the signal at the voltage level Vb, for example, a high-level signal, the inverter IV2 outputs a signal at the voltage level Vl at the connection point A to the gate of the high-side switch Nh. For example, because the control signal for turning off the high-side switch Nh is output to the gate of the high-side switch Nh, the high-side switch Nh is turned off.

The voltage Vb at the high-potential terminal of the capacitor C1 may be 5 V that is substantially the same as the power supply voltage Vi.

The inverted signal Spx for turning on the low-side switch Nl is supplied to the input buffer 16. Upon receiving the inverted signal Spx that is a high-level signal, the input buffer 16 outputs a signal at the voltage level Vi to the gate of the low-side switch Nl, so that the low-side switch Nl is turned on.

Because the low-side switch Nl is on, the capacitor C1 is charged by the DC voltage source 14.

The inductor L releases magnetic energy, so that the output voltage Vo smoothed by the capacitor C2 is supplied to the load 15.

Figure 5:
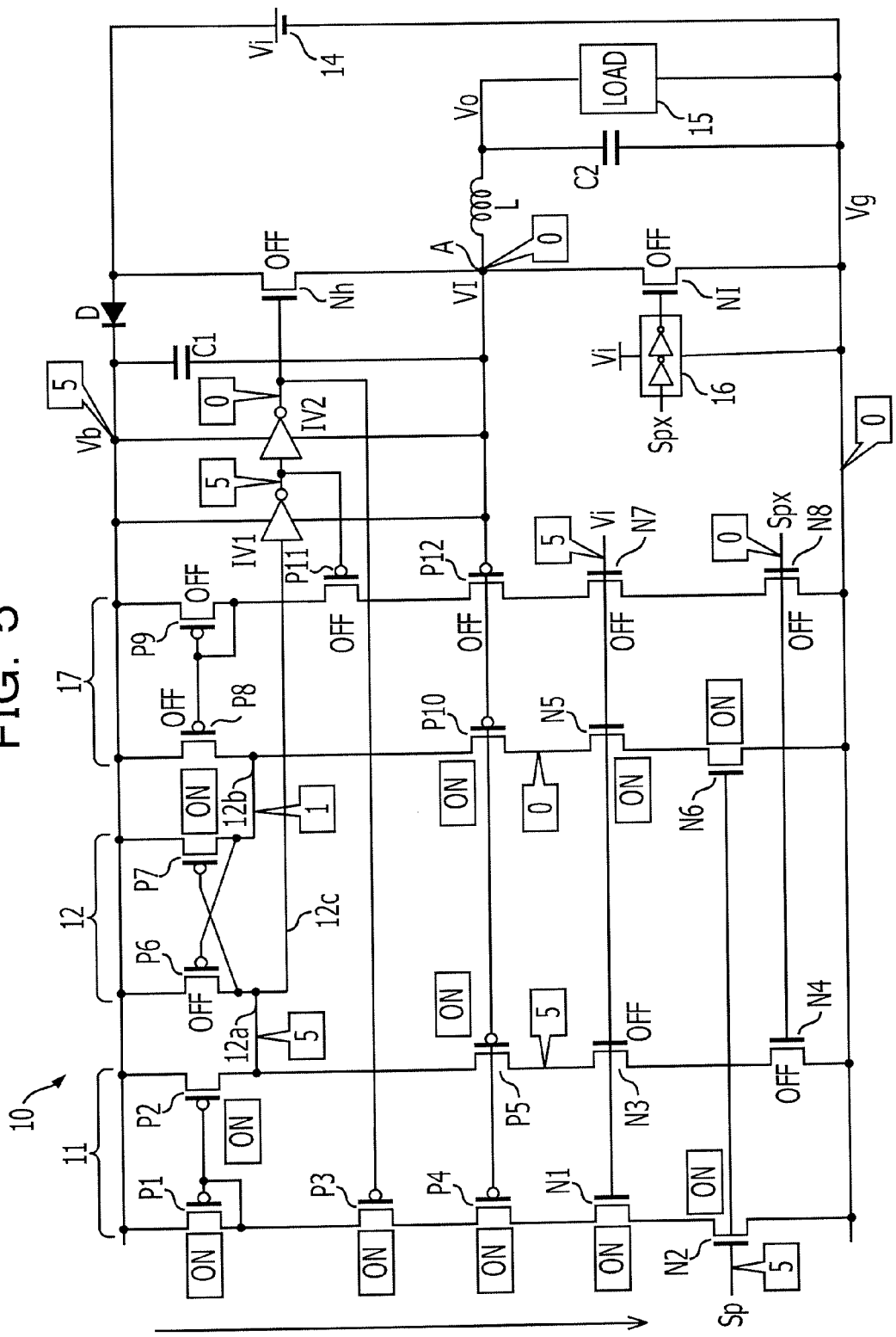
FIG. 5 illustrates an example of an operation of an example DC-DC converter.

Referring to FIG. 5, the control signal Sp for turning on the high-side switch Nh is supplied to the gate of the transistor N2 of the buffer 11. The inverted signal Spx of the control signal Sp for turning on the high-side switch Nh is supplied to the gate of the transistor N4. The transistors P1 and P2 are turned on. A high-level signal corresponding to the control signal Sp is output from the drain of the transistor P2 to the first input terminal 12a of the latch 12.

In the buffer 11, the transistors P1, P3, P4, N1, and N2 are turned on. A high-voltage side at the voltage Vb may be short-circuited to a low-voltage side at the voltage Vg, thus causing a current path.

The inverted signal Spx of the control signal Sp for turning on the high-side switch Nh is supplied to the gate of the transistor N8 of the auxiliary buffer 17. The control signal Sp for turning on the high-side switch Nh is supplied to the gate of the transistor N6. Although the transistors P8 and P9 are off, the transistors P10, N5, and N6 are turned on. A low-level signal corresponding to the inverted signal Spx is output from the drain of the transistor P8 to the second input terminal 12b of the latch 12.

The latch 12 retains the high-level signal supplied from the buffer 11 and outputs the high-level signal at the output terminal 12c to the inverter IV1.

Upon receiving the high-level signal, the inverter IV1 outputs a signal at the voltage level Vb to the inverter IV2.

Upon receiving the signal at the voltage level Vb, for example, a high-level signal, the inverter IV2 outputs a signal at the voltage level Vl at the connection point A to the gate of the high-side switch Nh. The high-side switch Nh remains off.

The input buffer 16 is supplied with the inverted signal Spx for turning off the low-side switch Nl. Upon receiving the low-level signal, the input buffer 16 outputs a signal at the voltage level Vg to the gate of the low-side switch Nl. The low-side switch Nl is turned off.

Figure 6:
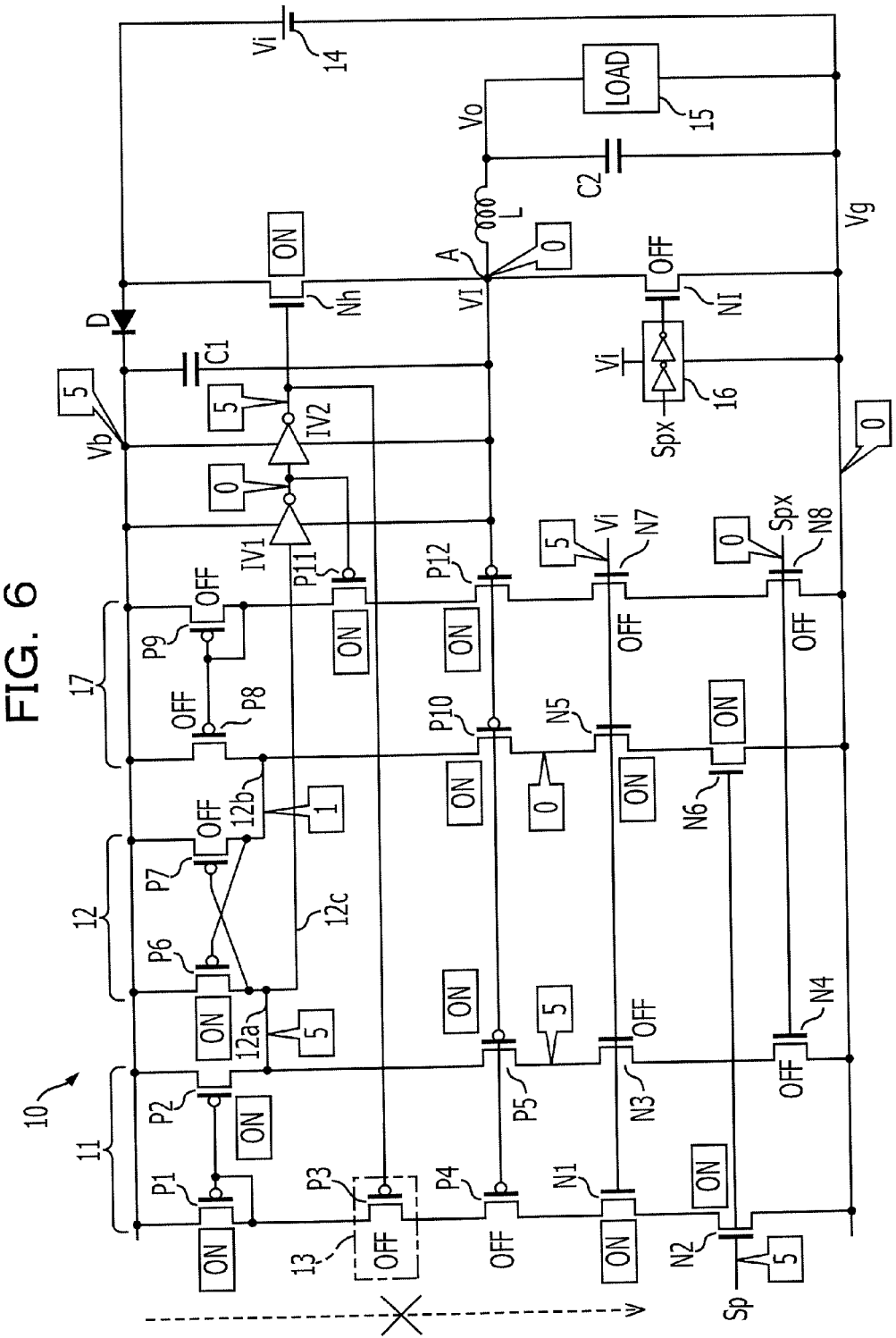
FIG. 6 illustrates an example of an operation of an example DC-DC converter.

Referring to FIG. 6, the inverter IV1, which has received the high-level signal, outputs a signal at the voltage level Vl at the connection point A to the inverter IV2.

Upon receiving the signal at the voltage level Vl at the connection point A, for example, a low-level signal, the inverter IV2 outputs a signal at the voltage level Vb to the gate of the high-side switch Nh. For example, a control signal for turning on the high-side switch Nh is output to the gate of the high-side switch Nh, so that the high-side switch Nh is turned on.

In this state, the voltage Vb at the high-potential terminal of the capacitor C1 may remain at 5 V that is substantially equal to the power supply voltage Vi. The voltage Vl at the connection point A may remain at 0 V that is substantially equal to the voltage Vg. A voltage difference between the gate and the drain of the high-side switch Nh may be 5 V that corresponds to the difference between the voltage Vb and the voltage Vl.

The high-level signal corresponding to the control signal Sp is supplied from the inverter IV2 to the gate of the transistor P3 of the buffer 11. Upon receiving the high-level signal at the gate, the transistor P3 is turned off. The current path from the transistor P1 to the transistor N2 is interrupted and the buffer 11 is deactivated.

Because the second input terminal 12b of the latch 12 is supplied with the low-level signal corresponding to the inverted signal Spx from the auxiliary buffer 17, the latch 12 retains the high-level signal supplied from the buffer 11 and continues to output the high-level signal at the output terminal 12c to the inverter IV1.

Because the high-side switch Nh is turned on, the capacitor C2 begins to be charged by the DC voltage source 14.

Figure 7:
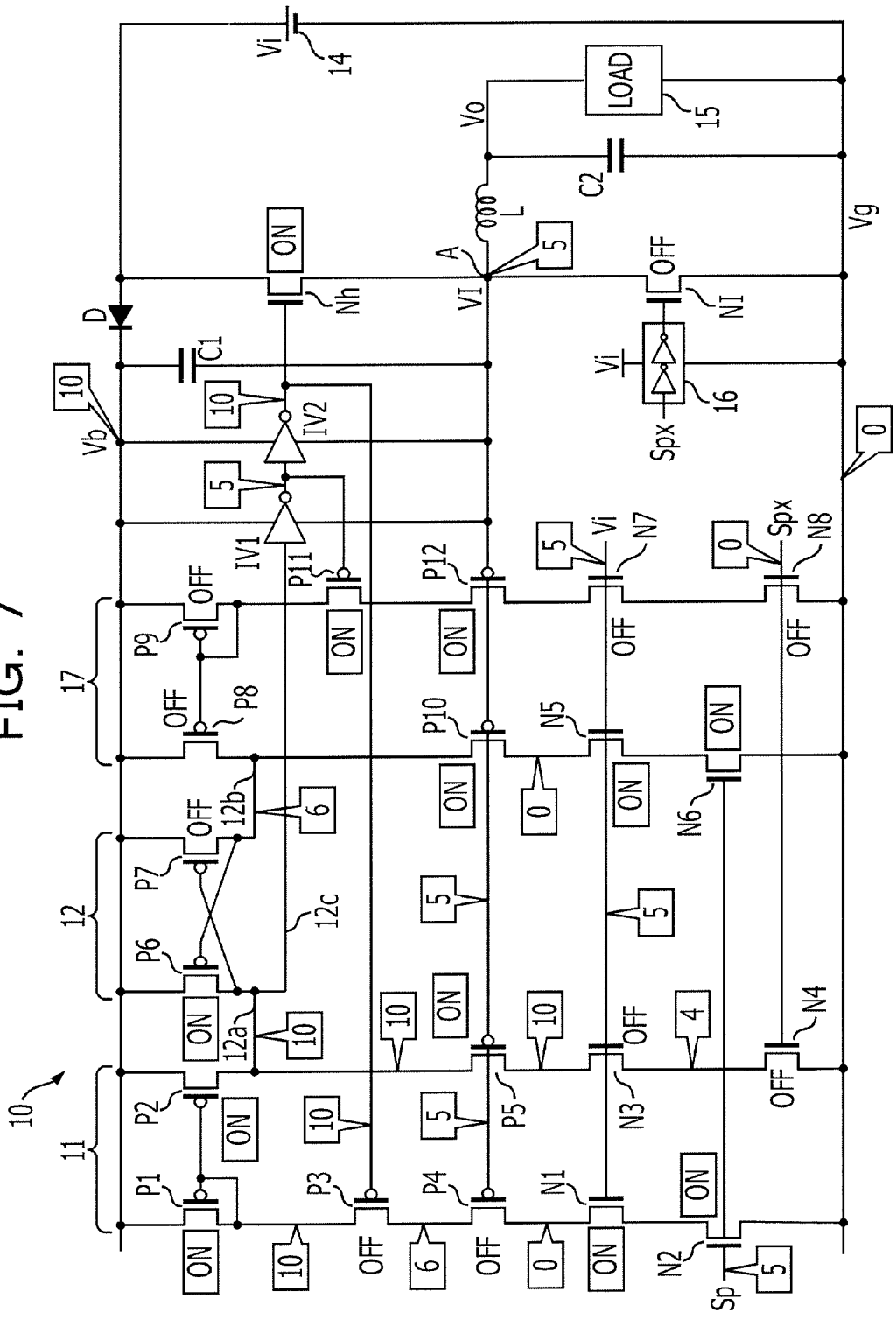
FIG. 7 illustrates an example of an operation of an example DC-DC converter.

Referring to FIG. 7, charged voltages of the capacitors C1 and C2 coupled in series are added, so that the voltage Vb rises to 10 V, for example. The voltage Vl at the connection point A rises to 5 V with increasing the charged voltage of the capacitor C2. The voltage difference between the gate and the drain of the high-side switch Nh may remain at 5 V that corresponds to the difference between the voltage Vb and the voltage Vl.

As the voltage Vb rises to 10 V, a voltage at the drain of each of the transistors P1, P2, and P6, which are on, may rise to 10 V.

A voltage applied to the gate of the transistor P3 of the buffer 11 may rise to 10 V.

A voltage at the drain of the transistor P3 of the buffer 11 may rise to approximately 6 V with increasing the voltage Vb. Accordingly, a gate-to-drain voltage or a source-to-drain voltage of the transistor P3 may be lower than 10 V and be equal to or less than the withstand voltage of the transistor P3.

A source-to-drain voltage of the transistor P4 of the buffer 11 may be approximately 6 V and be equal to or less than the withstand voltage of the transistor P4.

A source-to-drain voltage of the transistor N3 of the buffer 11 may be approximately 6 V and be equal to or less than the withstand voltage of the transistor N3.

In the buffer 11, because the transistors P3, P4, N1, P5, and N3 are arranged as illustrated in FIG. 3, a voltage applied to each transistor is reduced to be equal to or less than the withstand voltage of the transistor.

When the voltage Vi of the DC voltage source 14 is applied via the high-side switch Nh to the inductor L, the inductor L stores magnetic energy and self-induction produces an electromotive force. Consequently, the voltage Vi decreases and the output voltage Vo smoothed by the capacitor C1 is supplied to the load 15.

Figure 8:
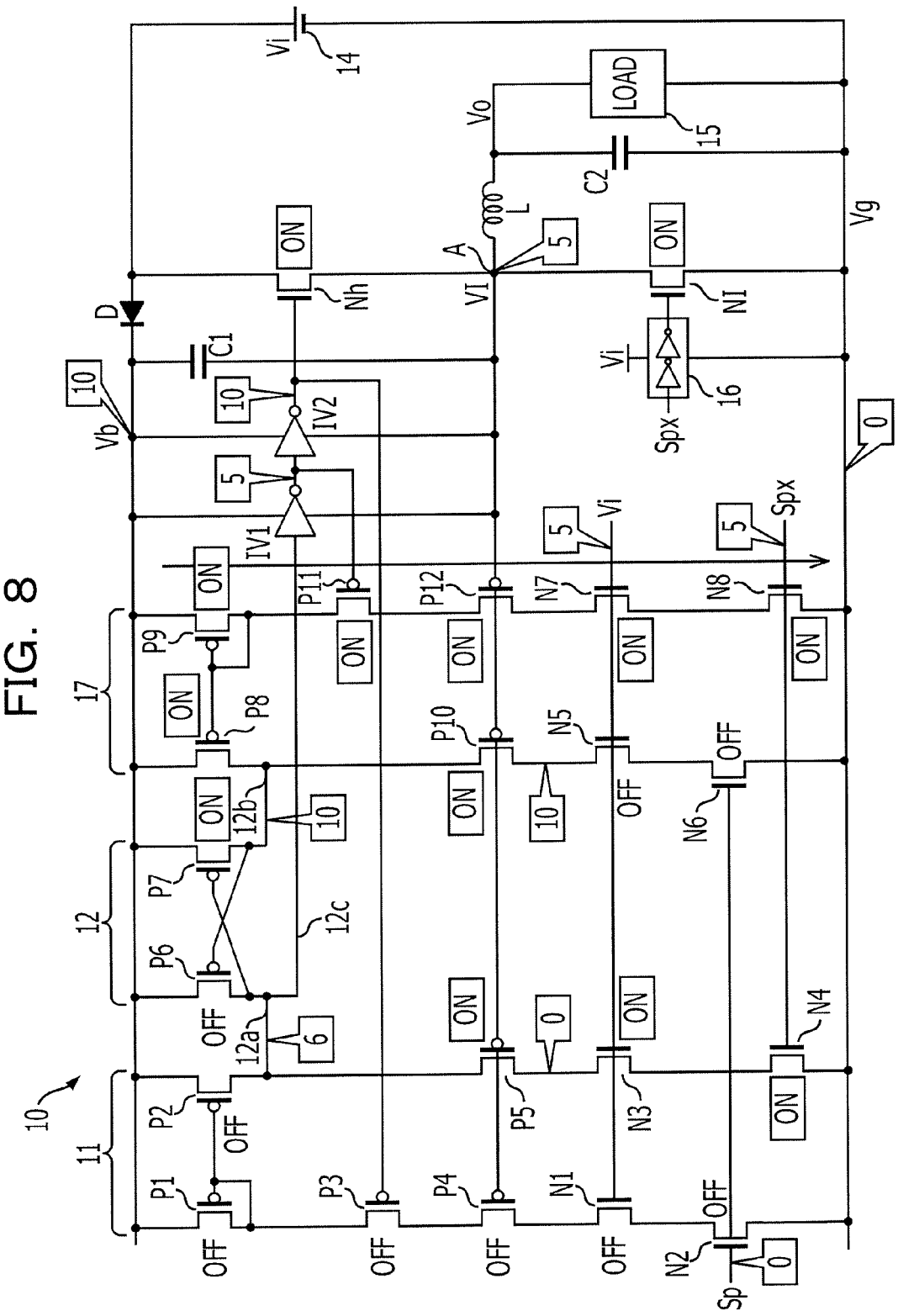
FIG. 8 illustrates an example of an operation of an example DC-DC converter.

Referring to FIG. 8, the control signal Sp for turning off the high-side switch Nh is supplied to the gate of the transistor N2 of the buffer 11. The inverted signal Spx of the control signal Sp for turning off the high-side switch Nh is supplied to the gate of the transistor N4. The transistors P1, P2, P3, P4, N1, and N2 are turned off and the transistors P5, N3, and N4 are turned on. Accordingly, a low-level signal corresponding to the control signal Sp is output from the drain of the transistor P2 to the first input terminal 12a of the latch 12.

The inverted signal Spx of the control signal Sp for turning off the high-side switch Nh is supplied to the gate of the transistor N8 of the auxiliary buffer 17. The control signal Sp for turning off the high-side switch Nh is supplied to the gate of the transistor N6. The transistors P8 and P9 are turned on. A high-level signal corresponding to the inverted signal Spx is output from the drain of the transistor P8 to the second input terminal 12b of the latch 12.

In the auxiliary buffer 17, the transistors P9, P11, P12, N7, and N8 are turned on. A high-voltage side at the voltage Vb may be short-circuited to a low-voltage side at the voltage Vg, thus causing a current path.

The latch 12 retains the low-level signal supplied from the buffer 11 and outputs the low-level signal at the output terminal 12c to the inverter IV1.

The inverter IV1 is supplied with the low-level signal. The inverter IV1 outputs a signal at the voltage level VI at the connection point A to the inverter IV2.

Upon receiving the signal at the voltage level VI at the connection point A, for example, a low-level signal, the inverter IV2 outputs a signal at the voltage level Vb to the gate of the high-side switch Nh. Accordingly, the high-side switch Nh remains on. The voltage level Vb may be held at, for example, approximately 10 V.

The input buffer 16 is supplied with the inverted signal Spx for turning on the low-side switch NI. Upon receiving the high-level signal, the input buffer 16 outputs a signal at the voltage level Vi of the DC voltage source 14 to the gate of the low-side switch NI. Thus, the low-side switch NI is turned on.

Figure 9:
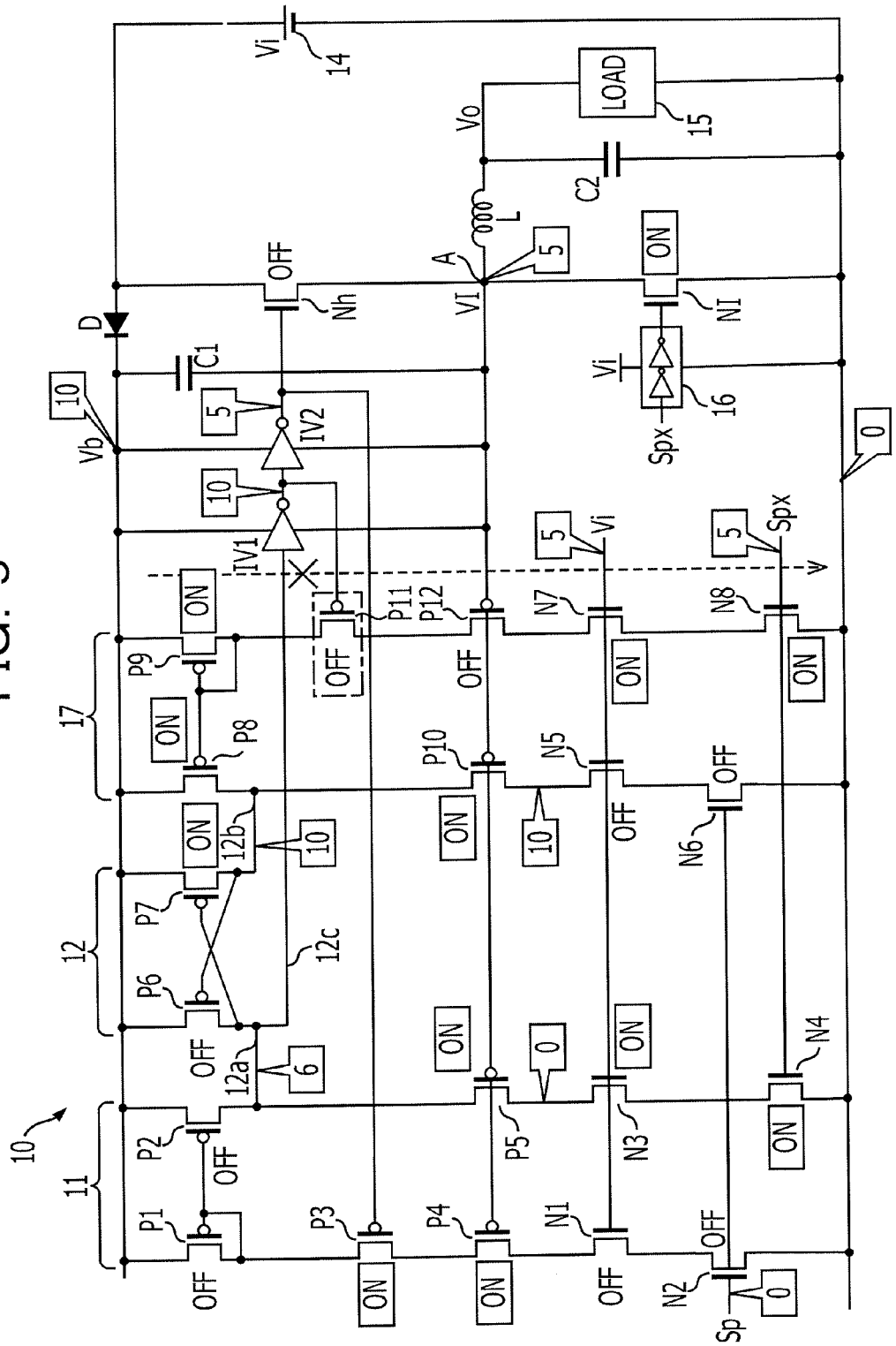
FIG. 9 illustrates an example of an operation of an example DC-DC converter.

Referring to FIG. 9, upon receiving the low-level signal, the inverter IV1 outputs a signal at the voltage level Vb to the inverter IV2.

Upon receiving the signal at the voltage level Vb, for example, a high-level signal, the inverter IV2 outputs a signal at the voltage level VI, which is the voltage at the connection point A, to the gate of the high-side switch Nh. For example, a control signal for turning off the high-side switch Nh is output to the gate of the high-side switch Nh, so that the high-side switch Nh is turned off. In this state, the voltage Vb at the high-potential terminal of the capacitor C1 remains at, for example, 10 V.

The high-level signal output from the inverter IV1 is supplied to the gate of the transistor P11 of the auxiliary buffer 17 in response to the control signal for turning off the high-side switch Nh. Upon receiving the high-level signal at the gate, the transistor P11 is turned off. The current path from the transistor P9 to the transistor N8 is interrupted and the auxiliary buffer 17 is deactivated.

After the auxiliary buffer 17 is deactivated, the low-level signal is continuously supplied from the buffer 11 to the first input terminal 12a of the latch 12. The latch 12 retains the low-level signal and continues to output the low-level signal to the inverter IV1.

Because the high-side switch Nh is off and the low-side switch NI is on, the capacitor C1 is charged by the DC voltage source 14. Because the low-side switch NI is on, the capacitor C2 begins to discharge.

Figure 10:
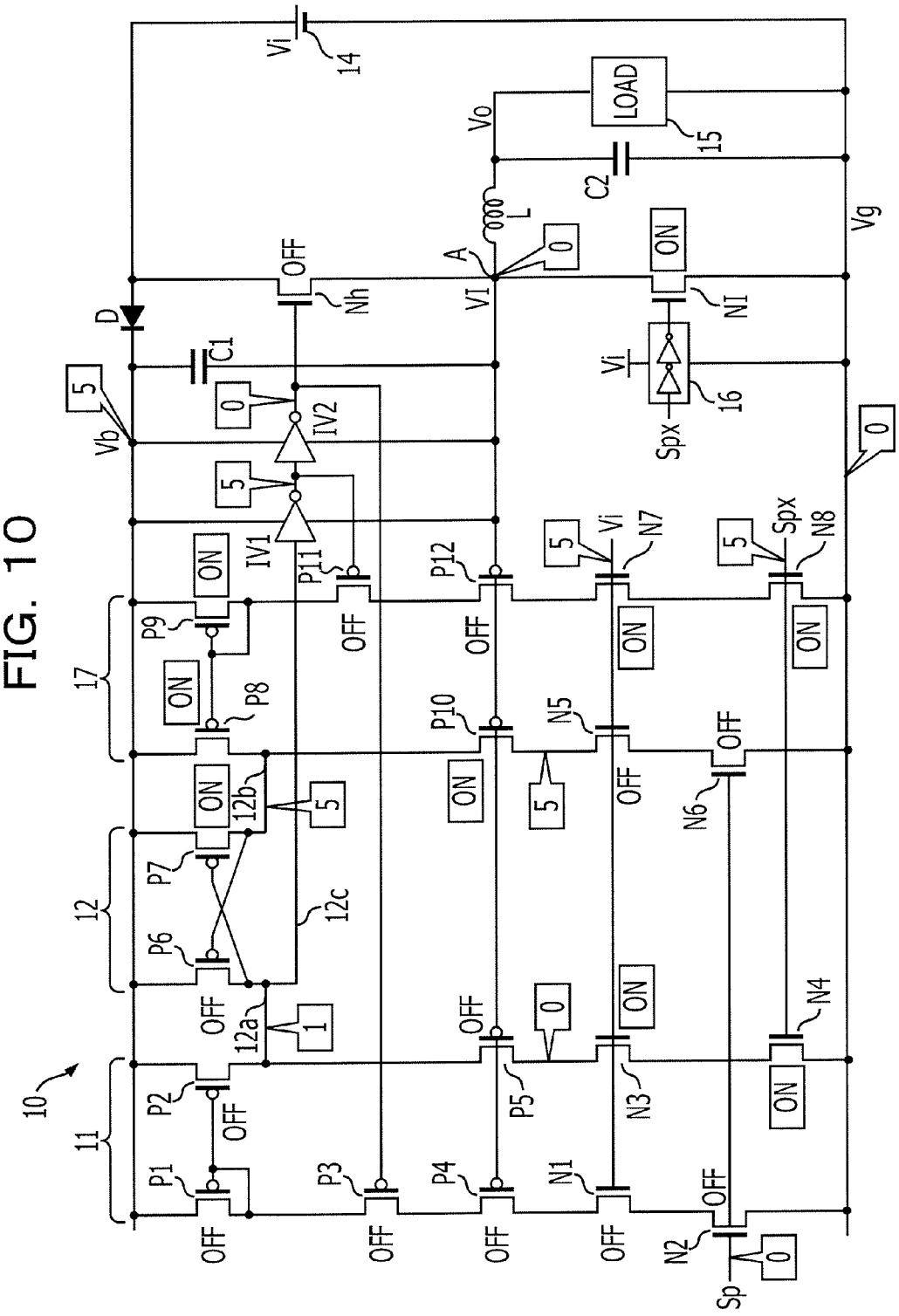
FIG. 10 illustrates an example of an operation of an example DC-DC converter.

Referring to FIG. 10, the voltage Vb at the high-potential terminal of the capacitor C1 decreases to 5 V. The discharge of the capacitor C2 allows the voltage VI at the connection point A to decrease to 0 V.

Because the voltage Vb decreases to 5 V, a voltage at the drain of each of the transistors P8 and P9, which are on, decreases to 5 V. The state may shift to that illustrated in FIG. 4.

A step-down DC-DC converter may be used. A step-up DC-DC converter including an inductor disposed at a different position from that in the above-described examples may be used.

The low-side switch may have a N-type polarity or a P-type polarity. A diode may be used as the low-side switch.

As regards the circuitry of each of the buffer 11, the latch 12, the auxiliary buffer 17, and the switch 13, another circuitry may be used.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A DC-DC converter comprising:
a high-side switch;
a low-side switch coupled to the high-side switch in series;
a capacitor configured to be charged while the low-side switch is turned on and to increase a driving voltage for turning on the high-side switch by a charged voltage;
a buffer configured to output a control signal for controlling the high-side switch;
a latch configured to receive the control signal at a first input terminal, retain the control signal, and output the control signal to the high-side switch; and
a switch, including a transistor provided between the buffer and a low-voltage power line and including a control terminal for receiving the control signal from the latch and configured to deactivate the buffer based on the control signal.

2. The DC-DC converter according to claim 1, further comprising:
a second buffer configured to receive an inverted signal of the control signal and output the inverted signal to a second input terminal of the latch.

3. The DC-DC converter according to claim 2, wherein the latch continues to output, in accordance with the inverted signal, the control signal for turning on the high-side switch to the high-side switch after deactivation of the buffer.

4. The DC-DC converter according to claim 2, further comprising:
a second switch configured to deactivate the second buffer in accordance with the control signal for turning off the high-side switch from the latch.

5. The DC-DC converter according to claim 1, wherein the high-side switch has a N-type polarity.

6. The DC-DC converter according to claim 1, further comprising:
    a diode disposed between the high-side switch and the capacitor.

7. The DC-DC converter according to claim 1, wherein the switch is further configured to deactivate the buffer by interrupting a path between the buffer and the low-voltage power line based on the control signal.

8. The DC-DC converter according to claim 1, further comprising:
    an auxiliary buffer provided between the latch and the high-side switch, the auxiliary buffer being configured to supply a signal obtained by inverting the control signal to the latch.

9. A semiconductor integrated circuit comprising:
    a DC-DC converter including:
        a high-side switch;
        a low-side switch coupled to the high-side switch in series;
        a capacitor configured to be charged while the low-side switch is turned on and to increase a driving voltage for turning on the high-side switch by a charged voltage;
        a buffer configured to output a control signal for controlling the high-side switch;
        a latch configured to receive the control signal at a first input terminal, retain the control signal, and output the control signal to the high-side switch;
        a switch configured to receive the control signal from the latch and deactivate the buffer based on the control signal; and
        an auxiliary buffer, provided between the latch and the high-side switch and configured to supply a signal obtained by inverting the control signal to the latch; and
    an inductor coupled to a connection node between the high-side switch and the low-side switch.

10. The semiconductor integrated circuit according to claim 9, wherein the DC-DC converter and the inductor are arranged on a single chip.

11. The semiconductor integrated circuit according to claim 9, wherein the DC-DC converter further comprises:
    a second buffer configured to receive an inverted signal of the control signal and output the inverted signal to a second input terminal of the latch.

12. The semiconductor integrated circuit according to claim 11, wherein the latch continues to output, in accordance with the inverted signal, the control signal for turning on the high-side switch to the high-side switch after deactivation of the buffer.

13. The semiconductor integrated circuit according to claim 11, wherein the DC-DC converter includes a second switch configured to deactivate the second buffer in accordance with the control signal for turning off the high-side switch from the latch.

14. The semiconductor integrated circuit according to claim 9, wherein the high-side switch has a N-type polarity.

15. The semiconductor integrated circuit according to claim 9, wherein the DC-DC converter includes a diode disposed between the high-side switch and the capacitor.

16. The semiconductor integrated circuit according to claim 9, wherein the switch is further configured to include a transistor provided between the buffer and a low-voltage power line and including a control terminal for receiving the control signal from the latch.

17. The semiconductor integrated circuit according to claim 9, wherein the switch is further configured to deactivate the buffer by interrupting a path between the buffer and a low-voltage power line based on the control signal.

18. A DC-DC converter comprising:
    a high-side switch;
    a low-side switch coupled to the high-side switch in series;
    a capacitor configured to be charged while the low-side switch is turned on and to increase a driving voltage for turning on the high-side switch by a charged voltage;
    a buffer coupled to a low-voltage power line and configured to output a control signal for controlling the high-side switch;
    a latch configured to receive the control signal at a first input terminal, retain the control signal, and output the control signal to the high-side switch; and
    a switch configured to receive the control signal from the latch and deactivate the buffer by interrupting a path between the buffer and the low-voltage power line based on the control signal.

19. The DC-DC converter according to claim 18, wherein the switch is further configured to include a transistor provided between the buffer and the low-voltage power line and to include a control terminal for receiving the control signal from the latch.

20. The DC-DC converter according to claim 18, further comprising:
    an auxiliary buffer provided between the latch and the high-side switch, the auxiliary buffer being configured to supply a signal obtained by inverting the control signal to the latch.

* * * * *